(12) United States Patent
Mactaggart

(10) Patent No.: US 8,767,784 B2
(45) Date of Patent: Jul. 1, 2014

(54) DRIVER FOR SUPPLYING MODULATED CURRENT TO A LASER

(75) Inventor: Iain Ross Mactaggart, Eden Prairie, MN (US)

(73) Assignee: Tyco Electronics Corporation, Berwyn, PA (US)

( * ) Notice: Subject to any disclaimer, the term of this patent is extended or adjusted under 35 U.S.C. 154(b) by 399 days.

(21) Appl. No.: 13/031,329

(22) Filed: Feb. 21, 2011

(65) Prior Publication Data

US 2012/0213237 A1    Aug. 23, 2012

(51) Int. Cl.
*H01S 3/00* (2006.01)
*H01S 3/13* (2006.01)

(52) U.S. Cl.
USPC .............. 372/29.012; 372/29.015; 372/38.01; 372/38.02; 372/38.04; 372/38.07

(58) Field of Classification Search
None
See application file for complete search history.

(56) References Cited

U.S. PATENT DOCUMENTS

| 4,744,087 A * | 5/1988 | Nicia ..................... 372/29.011 |
| 6,618,406 B1 * | 9/2003 | Kaminishi ................ 372/38.02 |
| 6,678,292 B2 | 1/2004 | Wickstrom et al. |
| 6,707,589 B2 * | 3/2004 | Bostak et al. ................. 359/245 |
| 7,006,543 B2 * | 2/2006 | Self et al. .................. 372/38.02 |
| 7,760,781 B1 | 7/2010 | Manan |
| 2003/0025972 A1 | 2/2003 | During et al. |
| 2004/0130397 A1 | 7/2004 | Mactaggart |
| 2010/0008662 A1 | 1/2010 | Bradbeer |

* cited by examiner

*Primary Examiner* — Jessica Stultz
*Assistant Examiner* — Sean Hagan

(57) ABSTRACT

A driver device for a laser includes a control device configured to generate a control current, an NPN differential amplifier connected to the control device and configured to superimpose a modulation current onto the control current to generate a combined current, and a laser activation switch coupled to the output of the NPN differential amplifier, the laser activation switch operating the laser utilizing the combined current. Also described herein is a communication system including a driver device.

19 Claims, 2 Drawing Sheets

DRIVER FOR SUPPLYING MODULATED CURRENT TO A LASER

BACKGROUND OF THE INVENTION

The subject matter disclosed herein relates generally to power supplies, and more particularly to a driver device for supplying power to a laser.

Optical communication systems typically utilize semiconductor diodes or lasers as the transmitter. An example of such a device is a vertical cavity surface emitting laser (VCSEL). Semiconductor lasers, including VCSELs, are operated above a threshold level which requires that a bias be applied to the device in order to maintain the laser in a lasing mode. In the lasing mode, a modulating signal is applied to the device centered about a set modulation current. This provides a modulated optical output signal.

Conventional driver circuits utilize both P-channel and N-channel devices to supply the modulating signal and the modulation current. For example, assume that the VCSEL is operational between a first power setting, wherein the VCSEL is lasing but at a reduced power level, and a second power setting, where the VCSEL is lasing at an increased power level. When the VCSEL is operated at the increased power setting, the P-channel device provides the maximum current to the VCSEL. However, when the VCSEL is operated at the reduced power level, the N-channel device steers a portion of the current to ground. As a result, a slower P-channel device is utilized to provide a constant current to enable the VCSEL to operate at the increased power level and the N-channel device is utilized to steer a portion of the current away from the VCSEL when the VCSEL is operated at the reduced power level.

As a result, the P-channel device generates the same relatively high current regardless of the operational mode of the VCSEL, thus increasing the power required to operate the VCSEL. Moreover, because the P-channel device is always active, the power dissipated by the VCSEL is relatively high. As communication systems become more complex and the quantity of VCSELs increase, the power consumption of the communication system also increases.

Therefore, a need remains for a VCSEL driver that is capable of operating at increased speeds while also supplying a modulated current to the VCSEL in a more energy efficient manner.

BRIEF DESCRIPTION OF THE INVENTION

FIG. 1 is a simplified block diagram of an exemplary driver device in accordance with various embodiments.

FIG. 2 is a schematic illustration of an exemplary driver device in accordance with various embodiments.

FIG. 3 is a top perspective view of a portion of an exemplary communication system formed in accordance with various embodiments.

BRIEF DESCRIPTION OF THE DRAWINGS

In one embodiment, a driver device for a laser is provided. The driver device includes a control device being configured to generate a control current, a differential amplifier connected to the control device, the differential amplifier superimposes a modulation current onto the control current to generate a combined current, and an NPN laser activation switch coupled to the output of the NPN differential amplifier, the NPN laser activation switch configured to operate the laser based on the combined current.

In another embodiment, a driver device for a vertical cavity surface emitting laser (VCSEL) is provided. The driver device includes an NPN transistor having a base, a collector, and an emitter, the emitter coupled to the VCSEL, a resistor coupled between a power supply and the collector, the NPN transistor configured to channel a current from the power supply to the VCSEL, a differential amplifier coupled to the base, the differential amplifier supplying a control current to the base to operate the NPN transistor, and a control device coupled between the differential amplifier and the power supply, the control device configured to compare a voltage across the resistor to a reference voltage and apply a bias voltage to the differential amplifier based on the comparison, the differential amplifier adjusting the control current based on the bias voltage.

In a further embodiment, a communication system is provided. The communication system includes an optical fiber, a light source adapted to transmit light through the optical fiber, and a driver device for supplying power to the light source. The driver device includes a control device being configured to generate a control current, an differential amplifier connected to the control device, the NPN differential amplifier superimposes a modulation current onto the control current to generate a combined current, and an NPN laser activation switch coupled to the output of the differential amplifier, the laser activation switch configured to operate the laser based on the combined current.

DETAILED DESCRIPTION OF THE INVENTION

Described herein is an exemplary driver device that may be utilized to supply power to a laser, such as a common-cathode solid-state laser. The driver device is configured to modulate the laser anode using a current that is derived from a positive supply rail. The driver device described herein provides increased energy efficiency compared to a traditional current shunt device. The driver device may include an NPN bipolar transistor that is placed in series with a small current-sensing resistor that compares a voltage follower current against a current reference using a low frequency control device. The driver device transforms the normally low impedance of the voltage follower into a high impedance at low frequencies by the use of feedback which is active only at low frequencies. This low frequency, current source like behavior, allows for automatic biasing of the solid state laser at DC. High speed modulation may then be applied to the input of the voltage follower.

Figure 1:
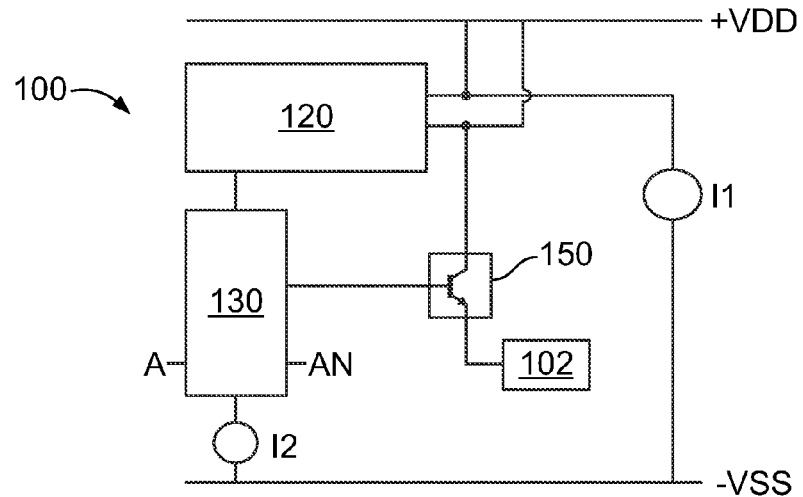

FIG. 1 is a simplified block diagram of an exemplary driver device 100 that is configured to provide a modulated current to the input of a laser, such as a vertically emitting solid state laser (VCSEL) 102.

The driver device 100 receives power from a positive voltage supply rail (VDD) and a negative voltage supply rail (VSS). The driver device 100 also receives a current signal from two current sources I1 and I2. In the exemplary embodiment, the driver device 100 includes a control device 120, an NPN differential amplifier 130, and a laser activation switch 150. The NPN differential amplifier 130 is coupled in electrical series with the control device 120. A first communication signal (A) and a second communication signal (AN) are each input to the NPN differential amplifier 130. In operation, the output from the NPN differential amplifier 130, which is transmitted to the laser activation switch 150, is proportional to the difference between the voltages applied to its two inputs, i.e. the difference between the signals A and AN. The output from the NPN differential amplifier 130 is utilized by the laser activation switch to operate the laser device 102.

For example, in operation, the control device 120 is configured to enable the laser activation switch 150 to operate as an emitter follower that behaves like a current source to provide current to the VCSEL 102 such that substantially all the current flows from the emitter to the collector of the laser activation switch 150 and substantially no current flows to the base of the laser activation switch 150. More specifically, the NPN differential amplifier 130 modulates the laser activation switch 150 such that at relatively high frequencies, the laser activation switch 150 functions as an emitter follower. Whereas, at lower frequencies, the output from the NPN differential amplifier 130 is relatively small because, the signal modulating the laser activation switch 150, which is present in A and AN, has very small amounts of low frequency energy due to the nature of the modulation coding scheme which is configured to substantially eliminate low frequency content.

Figure 2:
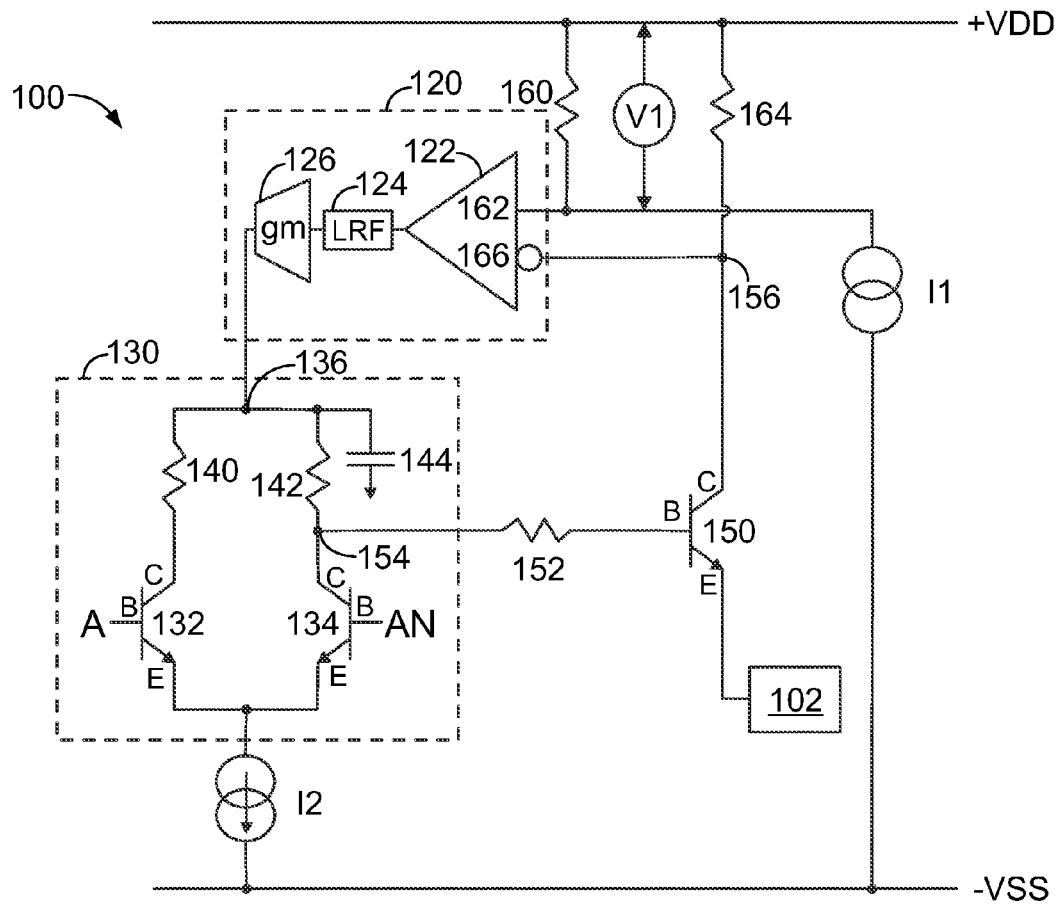

FIG. 2 is a schematic illustration of an exemplary electrical circuit that may be used to form the exemplary driver device 100 shown in FIG. 1. As discussed above, the driver device 100 receives power from the positive voltage supply rail (VDD) and the negative voltage supply rail (VSS). The driver device 100 also receives a current signal from the two current sources I1 and I2. In the exemplary embodiment, the control device 120 includes an operational amplifier 122, a low-pass filter 124, and a voltage-to-current element 126. It should be realized that the control device 120 shown in FIG. 2 is exemplary, and that the control device 120 may have other configurations.

In the exemplary embodiment, the NPN differential amplifier 130, also referred to herein as a differential pair, includes a first N-channel device 132 and a second N-channel device 134 in an emitter-coupled configuration. In the exemplary embodiment, the first and second N-channel devices 132 and 134 are embodied as NPN transistors that each include a base (B), a collector (C), and an emitter (E). The N-channel devices 132 and 134 may be embodied as an n-type bipolar junction transistor (BJT) or an n-type junction gate field-effect transistor (JFET), for example. The NPN differential amplifier 130 is coupled in electrical series with the control device 120 via a node 136 which is also referred to herein as a virtual VDD. In the exemplary embodiment, the first communication signal (A) is input to the base (B) of the N-channel device 132 and the second communication signal (AN) is input to the base (B) of the N-channel device 134.

As shown in FIG. 2, the NPN differential amplifier 130 also includes a resistor 140 that is coupled between the collector (C) of the N-channel device 132 and the node 136, and a resistor 142 that is coupled between the collector (C) of the N-channel device 134 and the node 136. The NPN differential amplifier 130 also includes a high frequency decoupling capacitor 144 that is connected between node 136 and ground. The capacitor 144 is utilized to provide low impedance on the node 136 at high frequencies and serves to improve power supply noise immunity as well as to provide high frequency filtering in the controller feedback loop.

The current source I1 supplies current to the control device 120. The current source I2 supplies current to the NPN-differential amplifier 130. The output from the NPN differential amplifier 130 is input to a base (B) of the laser activation switch 150 via a resistor 152. Accordingly, the NPN laser activation switch 150 includes the base (B) that is coupled to a node 154 that represents the output of the NPN differential amplifier 130, an emitter (E) that is connected to the laser 102, and a collector (C) that is connected to a node 156 that represents an input to the operational amplifier 122. The laser activation switch 150 may also be referred to herein as an emitter follower 150.

The driver device 100 also includes a resistor 160 that is connected between VDD and an input 162 of the operational amplifier 122, and a resistor 164 that is connected between VDD and the node 156 which is connected to a second input 166 of the operational amplifier. Moreover, the current source I1 is connected to the operational amplifier input 162. In operation, the driver device 100 functions to supply power to the VCSEL 102 in a manner that is more efficient than conventional drivers and thus utilizes less power and operates at higher speeds than conventional PNP drivers.

In the exemplary embodiment, the control device 120 is configured to enable the laser activation switch 150 to operate as an emitter follower that behaves like a current source at low frequencies, through the action of the controller, to provide current to the VCSEL 102. More specifically, the resistor 164 is placed in series with the collector of the laser activation switch 150. Therefore, in operation, substantially all the current flows from the emitter to the collector of the laser activation switch 150 and substantially no current flows to the base of the laser activation switch 150. The voltage across the resistor 164 thus provides an indication of the current being input into the NPN laser activation switch 150 and also the current being input into the VCSEL 102. The control device 120 is configured to function at low frequencies. Specifically, the amplifier 122, which in the exemplary embodiment, is a voltage gain amplifier, compares the voltage across the resistor 164 to a reference voltage V1 that is developed by the current source I1 and the resistor 160. The control device 120 then functions to maintain the same voltage V1 across the resistor 164 by adjusting the output of the control device 120, denoted as virtual VDD node 136. Because of the amplifier gain, the amplifier 122 functions to maintain approximately zero volts across it inputs, such that the control device 120 acts to put the voltage V1 across the resistor 164 even though V1 is on the other input side of the amplifier 122.

Turning to the NPN differential amplifier 130, as discussed above, the NPN differential amplifier 130 includes the N-channel devices 132 and 134. The base of each N-channel device 132 and 134 is connected to an input denoted as A and AN, respectively. The inputs A and AN may be, for example, high-frequency, e.g. 10 Gbit per second modulated signals. The current output from the NPN differential amplifier 130 is transmitted through the resistor 152 to the base of the laser activation switch 150 and modulates the laser activation switch 150. At relatively high frequencies, e.g. 10 Gbit per second, the laser activation switch 150 is modulated as an emitter follower. Whereas, at lower frequencies, e.g. much less than 10 Gbit per second, the controller also modulates the base of laser activation switch 150 through the continual low frequency adjustment of Virtual Vdd, node 136, by the controller. The base of laser activation switch 150, is therefore controlled by two signal sources, namely 1) the high speed modulation signal from differential amplifier 130, that sets the modulation depth and 2) the low speed signal from the controller that is applied to Virtual Vdd node 136 that sets the average current flowing in both the laser activation switch 150 and the laser itself.

For example, in one exemplary embodiment, it may be desirable to modulate the laser activation switch 150 between 2 ma and 10 ma, wherein at 10 ma the VCSEL 102 is above a threshold level in order to maintain the VCSEL 102 laser in a lasing mode and 2 ma is below the threshold level wherein the VCSEL 102 is still lasing but at a reduced power level. Moreover, in the exemplary embodiment, it may be desirable to maintain an average current to the VCSEL 102, which in the exemplary embodiment is 6 ma. It should be realized that the 6 ma value is exemplary and that the current maintained by the laser activation switch 150 is between 4 ma and 8 ma, 3 ma and 9 ma, and/or 2 ma and 10 ma, for example.

In the exemplary embodiment, the average current, e.g. 6 ma, maintained by the laser activation switch 150 is a multiple of the current output from the current source I1. To facilitate maintaining the average current, in the exemplary embodiment, the resistors 160 and 164 are of the same resistor type. Resistor types may include, for example, carbon composition resistors, film or cermet resistors, wire-wound resistors, semiconductor resistors, etc. Accordingly, when the current from current source I1 is input to the resistor 160, because the resistor 160 and the resistor 164 are the same type of resistor, if the resistance value of the resistor 164 is slightly larger than the design value, the resistance value of the resistor 160 will also be slightly larger. For example, assume that the resistive design value of the resistor 164 is 20 ohms, and the resistive design value of the resistor 160 is 2K ohms, if the actual resistive value of the resistor 164 is 30 ohms, then the actual resistive value of the resistor 160 would be approximately 3K ohms. Thus, utilizing the same type of resistor for the resistors 160 and 164 facilitates maintaining a substantially constant resistive ratio between the resistor 160 and the resistor 164.

Additionally, because the operational amplifier 122 is connected between the resistor 160 and the resistor 164, the operational amplifier 122 operates to maintain the same voltage on the resistor 160 that is on the resistor 164. In other words, the current from the current source I1, i.e. the reference current, is linked to the current in the laser activation switch 150. For example, assuming that I1 is set to 100 microamps, the 100 microamps flows into the resistor 160 and establishes the voltage V1. Moreover, assuming that the resistive value of the resistor 160 is 1 kohm, then the voltage V1 is 100 millivolts. Therefore, the current source I1 establishes 100 millivolts on the lower side of the resistor 160. The control device 120, via the NPN differential amplifier 130, adjusts the current flowing into the base of the laser activation switch 150 until the voltage across the resistor 164 is also approximately 100 millivolts. In operation, the control device 120 has a very high gain, so the control device 120 continually adjusts the current applied to the base of the laser activation switch 150 until the voltage across the resistor 160 is also approximately 100 millivolts. Because the current in the laser activation switch 150 is I1 multiplied by the ratio of 160/164, utilizing the same type of resistor enables the driver device 100 to provide a very accurate current output to the VCSEL 102 which enables the VCSEL 102 to be controlled in a more precise manner.

In operation, the control device 120 looks at the voltage across the resistor 164 and identifies a voltage that directs the NPN differential amplifier 130 to result in 6 ma of current in the laser activation switch 150. More specifically, the voltage across the resistor 164 indicates the average current being input to the laser activation switch 150. In operation, the control device 120 is not concerned with what the value of the actual voltage across the resistor 164. Rather, the control device 120, using the low-pass filter 124, merely identifies the average voltage at the resistor 164.

For example, assuming that the VCSEL 102 is transitioned from 10 ma to 2 ma, i.e. a logic 1 to a logic 0, and assume that the average current is 6 ma, the output from the low-pass filter 124 is a relatively low frequency, e.g. 50 kHz or lower, when compared to the modulation signals A and An input to the NPN differential pair which may be 10 Gbit per second. Accordingly, the control device 120 adjusts the virtual VDD, moving the VDD up or down, to adjust the average voltage on the base of the laser activation switch 150 up or down. At very low frequencies, the NPN differential amplifier 130 is transformed from a source follower into a current source because, through the use of gain, the base of the laser activation switch 150 is adjusted such that the voltage across the resistor 164 is substantially constant, which is the definition of a current source. Therefore, regardless of the load placed on the driver device 100 or the voltage output of the laser activation switch 150, the control device 120 operates to maintain V1 across the resistor 164. In other words the control device 120 operates to maintain a substantially constant current through the laser activation switch 150 by enabling the NPN differential amplifier 130 to facilitate operation of the laser activation switch as a current source at very low frequencies down to DC. As a result, the control device 120 is ineffective at high frequencies, therefore the NPN differential amplifier 130 facilitates the laser driver to operate as a current source at low frequencies where there is a lot of gain in the control device 120. Moreover, the laser activation switch 150 functions as an emitter follower, e.g. a voltage source, at high frequencies.

More specifically, when the VCSEL 102 is coupled to the output of the laser activation switch 150, the control device 120 looks at the voltage across the resistor 164 which provides an indication of the current being supplied to the laser activation switch 150. The control device 120 then adjusts the virtual VDD, i.e. node 136, up or down by steering current from the control device 120 to the virtual VDD, to adjust the voltage at node 136 either upward to the actual VDD or downward from the actual VDD. As a result, the control device 120 modifies the actual base voltage of the laser activation switch 150 until the average current input to the laser activation switch 150 is approximately 6 mA.

If a 10 Gbit signal, for example, is applied to A and AN, the control device 120 will not respond to A and AN because A and AN are very high frequency signals compared to the control signal loop bandwidth that sets average current. Therefore, the control device 120 looks at the average low frequency current flowing through the laser activation switch 150, so at low frequencies the VCSEL 102 operates as a current source even though the VCSEL 102 is a voltage follower or emitter follower.

The driver device 100 therefore utilizes the low-frequency control device 120 to make the laser activation switch 150 look like a current source at low frequencies. At high frequencies, which are outside the bandwidth of the control device 120, the control device 120 is inoperative. Therefore, a modulation current is superimposed on top of the control current to generate a combined current that is utilized to adjust the modulation depth of the laser activation switch 150. Modulation depth as used herein is defined as the variation in instantaneous current supplied by the laser activation switch. In the exemplary embodiment, the modulation depth of the laser activation switch 150 is adjusted by varying I2 which sets the voltage swing on the resistor 140 and the resistor 142. In operation, the higher the current received from the current source I2, the larger the voltage swing that occurs on the resistor 142 and on the collector of the transistor 134 such that the dynamic current entering the VCSEL 102 is modified at very high speed. Therefore, the modulation depth of the VCSEL 102 is set by the current I2, whereas the average current output from the VCSEL 102 is set by the control device 120. In the exemplary embodiment, the modulation depth is set based on the VCSEL being powered by the driver device 100.

Thus, the driver device 100 is configured to operate in two modes. In a first mode, also referred to as the low-frequency mode, the control device 120 operates such that the laser activation switch 150 functions as a current source and therefore identifies the appropriate operating point for the VCSEL 102 as described above. In the second mode of operation, also referred to as the high-frequency mode, the driver device 100 generates a modulation current which is superimposed on the current generated by the control device 120. Therefore, driver device 100 is enabled to provide the benefits of a current source driver at low frequency operation to set the power into the VCSEL 102 and also provides an NPN high frequency modulation source which is considerably faster than a conventional PNP source.

In operation, I1 is a reference current and I2 is utilized to set the modulation depth of the VCSEL 102. As a result, the signal on the collector of the n-channel device 134 is summed with the signal from the resistor 142, wherein the signal on the resistor 142 is a DC signal that sets the average current on the VCSEL 102 and the signal on the collector of the N-channel device 134 is a modulation signal which is an optical high-speed signal coming in from A and AN being transmitted to the VCSEL 102. If A is higher than AN, current is steered toward the resistor 140. Optionally, if AN is higher than A, current is steered toward the resistor 142. As a result, an NPN differential pair generates a differential signal that is antiphase. Generally, the N-channel devices 132 and 134 are utilized to combine the DC control device DC signal with the high speed modulation and apply the combined signal to the base of the laser activation switch 150 via the resistor 152.

Assume that A and AN are equal voltage such that the current I1 is being sent equally to the resistors 140 and 142. If the current I2 is increased, the virtual VDD at node 136 is increased causing the current on the N-channel device 134 to increase. Because the collector of the N-channel device 134 decreases as the current I2 increases, the control device 120 operates to increase the virtual VDD to maintain the average current at the laser activation switch 150. Additionally, if I2 is increased, to increase the modulation depth, the control device 120 increases the voltage on the virtual VDD, because raising I2 reduces the average voltage on the resistor 142 and the base of the laser activation switch 150. The control device 120 will act to maintain the average current seen at the laser activation switch 150 to at 6 mA, for example.

Figure 3:
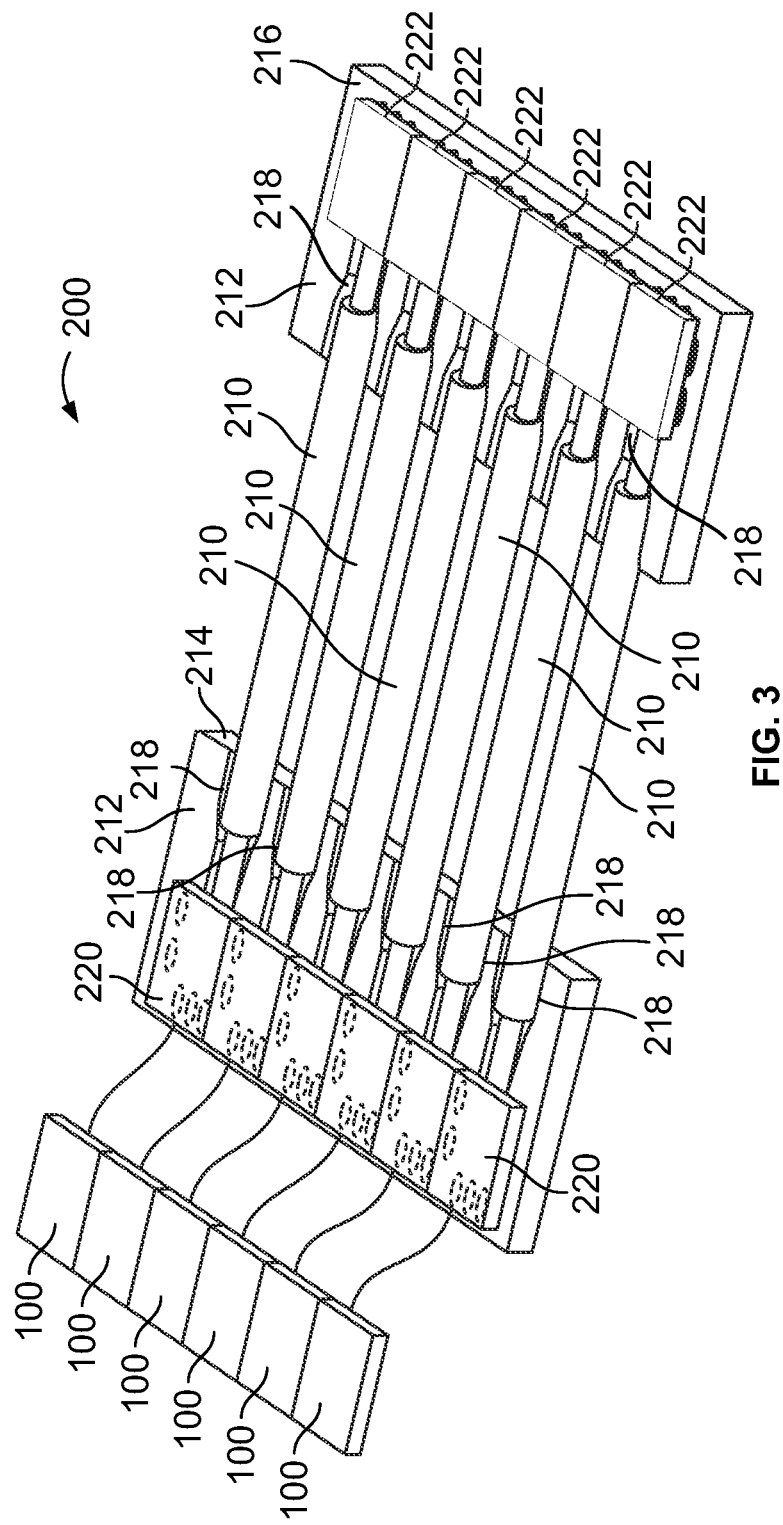

FIG. 3 is a top perspective view of a portion of an exemplary communication system 200 that may be fabricated to include the driver device 100 described herein. In the exemplary embodiment, the communications system 200 is a fiber optic communication system that includes a plurality of optical fibers 210. Each end of the optical fibers 210 may be mounted on a substrate 212 having a first portion 214 and a second portion 216. Each of the first and second portions 214 and 216 may be formed to include a plurality of grooves 218. For example, each of the substrate portions 214 and 216 may be formed to include six grooves wherein each end of a single optical fiber 210 is mounted in a respective groove. In one embodiment, the optical fiber 210 is a multimode optical fiber. Optionally, the optical fiber 210 may be a single mode fiber. The communication system 200 also includes a plurality of light sources 220. Each respective light source 220 is configured to supply a beam of light which is transmitted through a respective optical fiber 210 to a respective detector 222. In the exemplary embodiment, the light source 220 is a vertical-cavity surface-emitting laser (VCSEL). A VCSEL is a semiconductor laser diode that is configured to emit a beam of light perpendicular from the top surface of the VCSEL. In operation, the VCSEL emits a beam of light through the side of the optical fiber 210 (e.g., through the cladding of the optical fiber). The light is then transmitted through the optical fiber 210 to the detector 222. In the exemplary embodiment, each respective light source 220 is connected to a driver device 100. In operation, the driver device 100 provides the modulated current signals to operate the light source 220 as described above.

Described herein is a driver device that includes an NPN or N-channel MOS device, having a higher switching speed than a P-channel device, that is used to actively steer current into a common-cathode VCSEL device. The driver device includes a low frequency control device, i.e. the control device, that permits a constant average current to be set in a voltage follower connected to the VCSEL device. In operation, the control device sets up a current in the output NPN voltage follower. In operation, the modulation code that is applied to A, AN generally has either none or a very small low frequency content, i.e., is a DC balanced signal, such that the control device establishes a low frequency average current in the voltage follower, despite the high frequency modulation that may appear across the resistor 164. The control device unity gain point is set at a frequency considerably below the point at which there is frequency content in the input modulation code A, AN. In the exemplary embodiment, the resistors 160 and 164 are the same resistor type and the resistor 160 is a large multiple integer number equal to N times the resistive value of the resistor 164. The control device acts to set the current in the laser activation switch 150 to be equal to N times the resistive value of the resistor 160, which enables a small value reference current source I1 to set the current in the laser activation switch 150. The capacitor 144 is utilized to provide low impedance on the virtual VDD at high frequencies. The resistors 140 and 142 provide termination for the modulating current and also provide a means to sum the modulation signal and the low frequency control device signal that sets the DC current in the laser activation switch 150.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the invention without departing from their scope. While the dimensions and types of materials described herein are intended to define the parameters of the various embodiments of the invention, the embodiments are by no means limiting and are exemplary embodiments. Many other embodiments will be apparent to those of skill in the art upon reviewing the above description. The scope of the various embodiments of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments of the invention, including the best mode, and also to enable any person skilled in the art to practice the various embodiments of the invention, including making and using any devices or systems and performing any incorporated methods. The patentable scope of the various embodiments of the invention is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal languages of the claims.

What is claimed is:

1. A driver device for a laser, said driver device comprising:
a control device configured to generate a control current;
an NPN differential amplifier connected in series to the control device and configured to receive the control current generated by the control device, the NPN differential amplifier configured to superimpose a modulation current onto the control current to generate a combined current, wherein the control device is coupled between the differential amplifier and a power supply;
an NPN laser activation switch comprising an NPN transistor including a base coupled to the output of the NPN differential amplifier and configured to receive the combined current, wherein the NPN differential amplifier is interposed between the control device and the NPN laser activation switch, the NPN laser activation switch configured to operate the laser based on the combined current; and
a resistor coupled between the power supply and the NPN laser activation switch;
wherein the control device is configured to compare a voltage across the resistor to a reference voltage and apply a bias voltage to the differential amplifier based on the comparison.

2. The driver device of claim 1, wherein the laser comprises a vertical cavity surface emitting laser (VCSEL).

3. The driver device of claim 1, wherein the NPN differential amplifier comprises a first N-channel device and a second N-channel device that are disposed in an emitter-coupled configuration.

4. The driver device of claim 1, wherein the NPN differential amplifier is further configured to generate a modulation current having a frequency that is greater than a frequency of an average current generated by the control device.

5. The driver device of claim 1, wherein the driver device further comprises a virtual ground, the virtual ground utilized to sum a low frequency average current generated by the control device and a high frequency modulation current generated by the NPN differential amplifier.

6. The driver device of claim 1, wherein the NPN laser activation switch comprises a NPN field effect transistor (FET).

7. The driver device of claim 1, wherein the resistor comprises a first resistor connected in series between a voltage source and the NPN laser activation switch, the control device further configured to compare a voltage across the first resistor to a voltage across a second resistor to generate an average current, the average current being supplied to the laser.

8. The driver device of claim 7, wherein the first resistor and the second resistor are the same type.

9. The driver device of claim 7, wherein the first resistor has a resistance value that is a multiple of a resistance value of the second resistor.

10. A driver device for a vertical cavity surface emitting laser (VCSEL), said driver device comprising:
an NPN transistor having a base, a collector, and an emitter, the emitter coupled to the VCSEL;
a resistor coupled between a power supply and the collector, the transistor configured to channel a current from the power supply to the VCSEL;
a differential amplifier coupled to the base, the differential amplifier supplying a control current to the base to operate the NPN transistor; and
a control device coupled between the differential amplifier and the power supply, wherein an output of the control device is provided to the differential amplifier and an output of the differential amplifier is provided to the base of the NPN transistor as the control current, the control device configured to compare a voltage across the resistor to a reference voltage and apply a bias voltage to the differential amplifier based on the comparison, the differential amplifier configured to adjust the control current based on the bias voltage.

11. The driver device of claim 10 wherein the differential amplifier is further configured to superimpose a modulation current onto the control current.

12. The driver device of claim 10 wherein the differential amplifier is further configured to superimpose a modulation current onto the control current, the modulation current having a first frequency, the control current have a second frequency that is less than the first frequency.

13. The driver device of claim 10, wherein the control device comprises an operational amplifier coupled in series with a low-pass filter, the control device configured to regulate the average current supplied to the VCSEL.

14. The driver device of claim 13 further comprising a second resistor, the control device further configured to monitor a voltage across the second resistor to determine the reference voltage.

15. The driver device of claim 14, wherein the first resistor and the second resistor are the same type.

16. A communication system comprising:
an optical fiber;
a light source adapted to supply light to the optical fiber; and
a driver device for supplying power to the light source, the driver device comprising:
a control device configured to generate a control current;
an NPN differential amplifier connected in series to the control device and configured to receive the control current generated by the control device, the NPN differential amplifier configured to superimpose a modulation current onto the control current to generate a combined current, wherein the control device is coupled between the differential amplifier and a power supply;
an NPN laser activation switch comprising an NPN transistor including a base coupled to the output of the differential amplifier and configured to receive the combined current, wherein the NPN differential amplifier is interposed between the control device and the NPN laser activation switch, the laser activation switch configured to operate the laser based on the combined current; and
a resistor coupled between the power supply and the NPN laser activation switch;
wherein the control device is configured to compare a voltage across the resistor to a reference voltage and apply a bias voltage to the differential amplifier based on the comparison.

17. The communication system of claim 16, wherein the light source comprises a vertical cavity surface emitting laser (VCSEL).

18. The communication system of claim 16, wherein the NPN differential amplifier comprises a first N-channel device and a second N-channel device disposed in an emitter-coupled configuration.

19. The communication system of claim 16, wherein the NPN differential amplifier is further configured to generate a modulation current having a frequency that is greater than a frequency of the control current.

* * * * *